United States Patent [19]

Berkman et al.

[11] 4,099,924

[45] Jul. 11, 1978

[54] APPARATUS IMPROVEMENTS FOR GROWING SINGLE CRYSTALLINE SILICON SHEETS

[75] Inventors: Samuel Berkman, Florham Park; Michel Thomas Duffy, Princeton Junction; Kyong-Min Kim, East Windsor; Glenn Wherry Cullen, Princeton, all of N.J.

[73] Assignee: RCA Corporation, New York, N.Y.

[21] Appl. No.: 778,105

[22] Filed: Mar. 16, 1977

[51] Int. Cl.² .................. C01B 35/00; B01J 17/18
[52] U.S. Cl. .................. 23/273 SP; 156/608;
156/DIG. 83; 156/DIG. 88; 156/617 SP;
423/325; 423/285; 427/93; 427/237
[58] Field of Search ....... 156/608, DIG. 83, DIG. 88;
423/344, 325 D, 285; 427/237, 94, 93, 419 F;
23/273 SP

[56] References Cited

U.S. PATENT DOCUMENTS

| | | | |
|---|---|---|---|
| 2,968,530 | 1/1961 | Forgeng | 423/325 D |
| 3,226,194 | 12/1965 | Kuntz | 423/344 |
| 3,453,352 | 7/1969 | Goundry | 156/608 |
| 3,650,703 | 3/1972 | Labelle | 156/DIG. 88 |

FOREIGN PATENT DOCUMENTS

| | | | |
|---|---|---|---|
| 656,987 | 6/1965 | Belgium | 156/DIG. 83 |
| 48-28568 | 4/1963 | Japan | 423/325 D |

OTHER PUBLICATIONS

Croft, Rev. of Ceramic Technology, #26, Feb. 1974, pp. 1–12.
Guzman, Translation from Ogneuoxy, #3, (pp. 41–46), Mar. 1970, pp. 177–182.
Ackermann, IBM Tech. Discl. Bulle, vol. 15, #12, May 1973, p. 3888.

*Primary Examiner*—Stephen J. Emery
*Attorney, Agent, or Firm*—H. Christoffersen; Birgit E. Morris; A. Stephen Zavell

[57] ABSTRACT

Mechanical components such as dies and crucibles, which come in contact with a silicon melt during the formation of single crystalline shaped silicon particles, e.g. thin sheets or ribbons, are coated with silicon oxynitride deposited by chemical vapor deposition techniques.

5 Claims, 7 Drawing Figures

APPARATUS IMPROVEMENTS FOR GROWING SINGLE CRYSTALLINE SILICON SHEETS

BACKGROUND OF THE INVENTION

Single crystalline silicon in the form of a thin sheet is desirable for several important reasons. It achieves materials savings in silicon utilization and provides product use possibilities in photovoltaic (solar cell) installations. It also offers a very low cost potential of making semiconductor ribbon by continuous process means for subsequent device fabrication.

Several investigators have explored various methods of growing single crystalline silicon sheet. Some of the known art for the purpose is revealed, amongst other sources, in: an article by A. V. Stepanov in Soviet Physics-Technical Physics, 49, 339 (1959); an article by J. C. Swartz, T. Surek and B. Chalmes in J. Electronic Materials, 4, 255 (1975); a report dated Dec. 15, 1975 prepared by G. H. Schwuttke et al entitled "SILICON RIBBON GROWTH BY A CAPILLARY ACTION SHAPING TECHNIQUE" identified as Quarterly Technical Progress Report No. 2 under JPL Contract No.: 954144 (a Subcontract under NASA Contract NAS70100 — Task Order No. RD-152; and a presentation of J. A. Zoutendyk at the "International Solar Energy Society Conference 'Sharing The Sun'" made Aug. 16 - 20, 1976 at Winnepeg, Manitoba, Canada and entitled "DEVELOPMENT OF LOW-COST SILICON CRYSTAL GROWTH TECHNIQUES FOR TERRESTRIAL PHOTOVOLTAIC SOLAR ENERGY CONVERSION". U.S. Pat. Nos. 3,393,054; 3,591,348; and 3,617,223 also pertain to this technology, as does the copending U.S. Patent Application entitled "APPARATUS FOR THE PRODUCTION OF RIBBON SHAPED CRYSTALS", Ser. No. 680,072, Filed Apr. 26, 1976.

Three newer processes used for single crystalline silicon sheet growth are known as: (i) the "Stepanov Technique"; (ii) the "Inverted Stepanov Technique"; and (iii) "Edge-Defined Film-Fed Growth" (i.e., "EFG"); plus various modifications thereof. The more conventional Czochralski silicon crystal growth method is also used. One of the essential differences between the first three processes lies in the contact angle ($\phi$) between the molten silicon and the die material. For EFG, $\phi$ should be much smaller than 90°. On the other hand, $\phi$ should be larger than 90° in the Stepanov Technique, while it can be more or less than 90° in the Inverted Stepanov Technique.

Molten and near molten (e.g., solidifying from the melt) silicon is extremely reactive. It tends to attack or corrode and/or become undesirably contaminated by practically all of the die and crucible materials that have been employed for growing single crystalline silicon sheet. This, obviously, is very undesirable.

A copending U.S. Patent Application entitled "Apparatus Means for Growing Single Crystalline Silicon Sheets", Ser. No. 732,865, filed Oct. 15, 1976, discloses that coating dies and crucibles with a layer of silicon nitride does protect the die and crucible materials from attack by and corrosion of molten silicon.

SUMMARY OF THE INVENTION

We have found that a silicon oxynitride layer applied by chemical vapor deposition onto a surface in contact with molten or near molten silicon offers improved protection for the surface from reaction with said silicon.

DETAILED DESCRIPTION OF THE INVENTION

Figure 1:
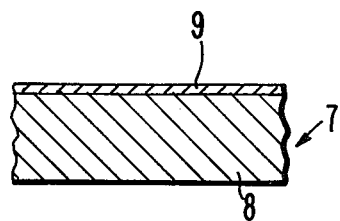
FIG. 1 is a cross-sectional view of part of a component having a protective layer and substrate according to the present invention.

Referring to FIG. 1, a component utilized in the growth of single crystalline silicon sheets or ribbon and capable of coming in contact with molten or near molten silicon during the growth process is designated as 7. The component 7 can be a die, crucible or the like. The component 7 includes a substrate 8, and a protective layer 9 of silicon oxynitride applied by chemical vapor deposition (CVD) techniques. The protective layer 9 is on at least those surfaces of the substrate 8 which may come in contact with molten or near molten silicon. Typically, the substrate 8 is of a refractory material.

Figure 2:
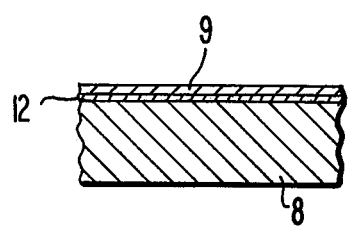
FIG. 2 is a cross-sectional view of the component of the present invention wherein the substrate is graphite.

Referring to FIG. 2 the protective layer 9 is on a substrate 8 of graphite. During the chemical vapor deposition of the protective layer 9, a thin silicon carbide (SiC) layer 12 may be formed between the silicon oxynitride protective layer 9 and the substrate 8.

Figure 3:
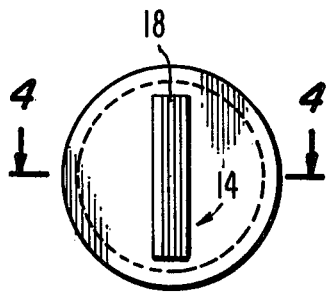
FIG. 3 is a simplified bottom plan view of apparatus useful for the Inverted Stepanov Technique of silicon crystal growth.
Figure 5:
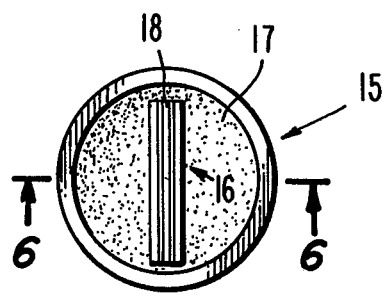
FIG. 5 is a simplified top plan view of apparatus useful for the EFG technique of silicon crystal growth.
Figures 4, 7:
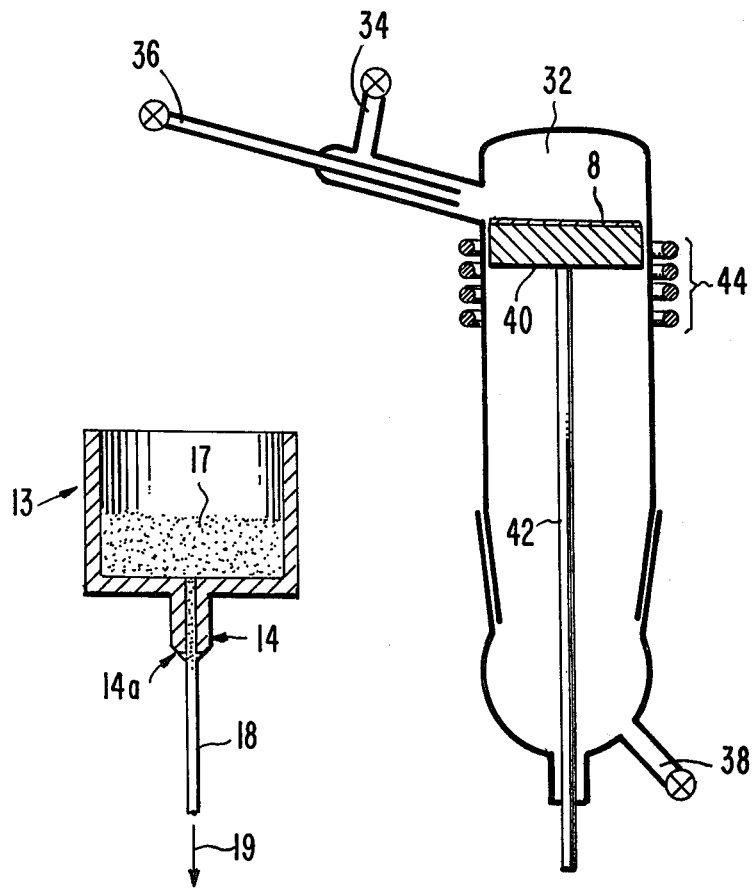
FIG. 4 is a cross-sectional view taken along line 4—4 in FIG. 3.
FIG. 7 is a cross-sectional view of a chemical vapor deposition apparatus used in fabricating the protective layer of the present invention.
Figure 6:
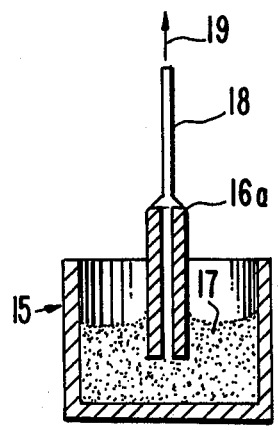
FIG. 6 is a cross-sectional view taken along line 6—6 of FIG. 5.

FIGS. 3 and 4 relate to the Inverted Stepanov method of silicon crystal growth, and FIGS. 5 and 6 relate to the EFG technique of silicon crystal growth.

With reference to FIGS. 3 - 6, inclusive, the crucibles and dies are sequentially designated by reference numerals 13, 14, 15 and 16. The liquid silicon melt 17 (which is at least about 1420° C. in temperature) is, in each case, contained within crucibles 13 and 15. Dies 14 and 16 are each respectively formed to have terminating outlet apices 14a and 16a. The thin sheet or ribbon of single crystalline silicon formed from each die is identified by reference numeral 18 as each proceeds from the dies 14 and 16 in the silicon ribbon growth direction indicated in each instance by directional arrow 19.

Although not detailed in FIGS. 3-6, the crucibles 13 and 15 and dies 14 and 16 include the protective layer 9.

The silicon oxynitride protective layer 9 has exceptional physical properties for the intended application. These include good mechanical stiffness, high thermal conductivity, and excellent chemical stability in contact with molten silicon as compared with many refractory materials.

Specifically, many of the characteristics of silicon oxynitride are detailed in the February 1974 (Issue No. 26) "REVIEW OF CERAMIC TECHNOLOGY" by Winston Duckworth published by the Battelle Columbus Laboratories. Additional information as to silicon oxynitrides is available in the respective articles, firstly by, D. M. Brown et al, on "Properties of $Si_xO_yN_z$ Films on Silicon" in the *The Journal Of The Electrochemical Society*, 115 (No. 3), 311 (1968) and, secondly by Herbert B. Phillip on "Optical Properties Of Silicon Nitride" in the same Journal, 120 (No. 2), 295 (1973). As stated hereinabove, a copending application, Ser. No. 732,865, does disclose a protective layer of silicon nitride ($Si_3N_4$) applied by CVD. However, silicon oxynitride has been found to provide a protective layer 9 of a more stable mechanical hardness when subjected to molten silicon than does silicon nitride. The mechanical hardness of a protective layer of silicon nitride and a protective layer of silicon oxynitride was tested in the following manner. A layer of CVD silicon nitride was applied to a substrate of reaction sintered silicon nitride, and a layer of CVD silicon oxynitride was applied to another substrate of reaction sintered silicon nitride. A silicon chip was placed on both the silicon nitride layer and the silicon oxynitride layer. The samples were placed in a furnace and heated to a temperature beyond the melting point of silicon, approximately 1450° C. After the samples were cooled the molten silicon solidified to form a silicon layer. The samples were sectioned and the profiles examined under a microscope. Both the silicon nitride layer and the silicon oxynitride layer remained intact on their respective substrates. The silicon layer was then removed from both samples, exposing both the silicon nitride layer and the silicon oxynitride layer. A scratch test was then performed on both exposed layers by using a probe. It was found that the silicon nitride layer tended to be chalky and was easily scratched away indicating that its mechanical hardness had deteriorated. The same scratch test was performed on the silicon oxynitride layer but its mechanical hardness appeared unchanged. The reasons for this difference is mechanical hardness between the silicon nitride and silicon oxynitride layers is not known at present.

The CVD procedure for providing a protective layer 9 of silicon oxynitride on the substrate 8 has distinct advantages over the methods of providing die materials such as "hot pressing" and "reaction sintering". The latter methods usually employ binders, such as MgO, which are volatile and reactive at liquid silicon temperatures. In addition, the latter methods produce materials having a granular structure leading to the removal of grains or particles from the matrix material when in contact with molten silicon. This results in contamination of the silicon melt. In contrast, CVD coatings are continuous, comparatively dense and pure materials which do not depend on binders for internal strength and coherence. Consequently, CVD layers deposited on refractory substrates can be advantageously used for contact with molten silicon.

As is known, effective CVD procedures for producing silicon oxynitride protective layer 9 involve passing mixtures of suitable reactant gases or vapors over (generally dispersed in a carrier gas) over the substrate being coated while heating the substrate to a temperature between about 800° C. and about 1,500° C.

Silicon oxynitride can be represented by the general empirical formula:

$SiO_xN_y$ with a possible composition ranging between that of silicon nitride ($Si_3N_4$) and that of silica ($SiO_2$). Silicon oxynitride can be deposited by means of CVD techniques, on a variety of appropriate refractory materials of substrate 8 suitably designed for silicon ribbon-growing purposes. The following reactions typify several of those that may be utilized to obtain a desired silicon oxynitride coating:

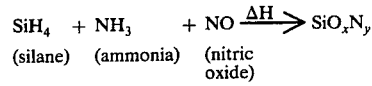
(silane) (ammonia) (nitric oxide)

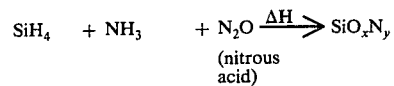
(nitrous acid)

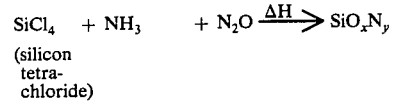
(silicon tetrachloride)

It is possible to employ several other chemical reactions.

The precise composition of the resulting silicon oxynitride protective layer 9 can be varied by merely controlling the relative amounts of the respective reactants being added to the deposition system. This, when desired, provides the opportunity of "grading" the composition of the CVD layer during deposition.

Preferably, the silicon oxynitride compositions prepared by CVD coating in practice of the present invention are of the more particularized formula $SiO_{(3/2)(x)}N_{(4/3)-(x)}$ wherein the value of $x$ is equal to or greater than 0.1, but equal to or less than 0.8 (i.e., $0.1 \leq x \leq 0.8$). Translated to percentages, the silicon oxynitride suited for practicing the present invention contains a mimimum of 5% by weight of oxygen and a maximum of 35% by weight of oxygen.

For the substrate 8, practically any shapeable, high temperature refractory material designed with adequate mechanical strength and having about the same coefficient of thermal expansion as the silicon oxynitride protective layer 9 can be utilized in practice of the present invention. Suitably the substrate 8 is graphite, fused silica, boron nitride, ceramic-bonded and/or reaction sintered silicon nitride compositions — such as those bonded with magnesium and aluminum oxides — and the like.

The protective layer 9 can have any desired thickness. Usually, however, a layer thickness in the range of from about 25 to about 200 micrometers is satisfactory. Thin layers are favored in cases where there is a mismatch in thermal expansion properties between the protective layer 9 and the substrate 8.

The dies 14 and 16 may be of any desired design best suited for silicon ribbon growth method used.

Referring to FIG. 7 a chemical vapor deposition apparatus for fabricating the protective layer 9 of the present invention is designated as 30. The CVD apparatus 30 includes a reaction chamber 32, a first inlet port 34, a second inlet port 36 and an outlet port 38. In the chamber 32 is a susceptor 40, typically of graphite, on a rotatable shaft 42. Radio frequency (RF) heating coils 44 surround the outside of the reaction chamber 32 in the general vicinity of the susceptor 40. The following fabrication of a protective layer 9 of a silicon oxynitride is given by way of example. A substrate 8 of reaction sintered silicon nitride is placed on the susceptor 40. Nitrogen ($N_2$) is then bled into the second inlet port 36 at a flow rate of 1600 cc/min. for the purpose of flushing the reaction chamber 32. The substrate 8 is then heated to a temperature of approximately 900° C. by energizing the the RF heating coils 44. Ammonia (NH₃) entering by the first inlet port 34 is bled into the reaction chamber 32 at a flow rate of approximately 3000 cc/min. Nitrous oxide (N₂O) is then introduced into the reaction chamber 32. The nitrous oxide is at a flow rate of approximately 400 cc/min. To complete the chemical reaction, a 3% silane in hydrogen mixture is bled into the reaction chamber 32, at a flow rate of approximately 100 cc/min. Both the nitrous oxide and 3% silane in hydrogen mixture are introduced into the CVD apparatus 30 through the second inlet port 36. The deposition of the silicon oxynitride protective layer 9 commences when the 3% silicon and hydrogen mixture is bled into the chamber 32.

A typical protective layer 9 of silicon oxynitride, on a substrate 8 of reaction sintered silicon nitride, of about 50 micrometers in thickness requires a deposition time of about 2 hours when the substrate temperature is maintained at about 1000° C.

Referring now to utilization of the present invention, i.e., the protective layer 9 on the substrate 8 in silicon ribbon growth, the melt 17 is frequently produced by heating a solid silicon bar, which may be monocrystalline or polycrystalline, above its melting point. Any of the conventional dopants may be incorporated in the silicon. The method of heating may be by radio frequency (RF) induction or other suitable means.

In the crucibles 13 and 15, the melt 17 is usually replenished by feed stock at a rate which corresponds essentially to the withdrawal rate of the grown silicon ribbon 18 so that the level of the melt 17 remains substantially constant. A temperature gradient is produced in the melt 17. The temperature of the liquid silicon melt just above the apices 14a and 16a is not far removed from that of the melting point of silicon. As a result of the steep temperature gradient, the silicon solidifies just about as it leave the melt 17.

When conventional crucibles and/or dies of graphite are used in the silicon growth techniques described, there is generally formed a silicon carbide (SiC) product of reaction between the hot silicon and the carbon in the graphite substrate. This SiC material results in undesirable solid particles or inclusions in the grown silicon ribbon product. These particles interfere with crystal growth and degrade resultant crystal quality. In a particular illustration of this, the efficiency in solar cells of silicon ribbon crystals having SiC whisker inclusions therein may be reduced to as low as 5% from the normal 15% or so found with silicon materials free of such inclusions. Likewise, in semiconductor and the like applications, it is known that silicon having SiC inclusions exhibit a different diffusion rate than inclusion-free stock and also that the lifetime associated with silicon electronic carriers goes down drastically if the carbon concentration therein is too high.

The present inventions' practice provides, very advantageously, silicon ribbon and equivalent products that are free from deleterious inclusions which are usually found when other substrate materials are employed in the apparatus from which the ribbon is produced.

What is claimed is:

1. In an apparatus for growing single crystalline silicon in sheet or ribbon form comprising a crucible and die in contact with molten silicon the improvement which comprises a protective layer of silicon oxynitride of the general formula $SiO_{(3/2)(x)}N_{(4/3)-(x)}$, wherein $x$ is equal to or greater than 0.1 but equal or less than 0.8, applied by chemical vapor deposition on the portions of said crucible and die in contact with said molten silicon.

2. An apparatus according to claim 1 wherein said chemical vapor deposition silicon oxynitride coating is applied in a reaction chamber purged with nitrogen and heated to about 900° C. in the presence of ammonia introduced into said chamber at a flow rate of about 3000 cc/min., nitrous oxide (N₂O) introduced into said chamber at a flow rate of about 400 cc/min., and a 3% silane in a hydrogen mixture introduced into said chamber of a flow rate of approximately 100 cc/min. for a time sufficient to provide an average thickness of said silicon oxynitride layer of about 25 to about 200 microns.

3. Apparatus according to claim 1, wherein said die and crucible is of a refractory material.

4. Apparatus according to claim 3, wherein said die and crucible is selected from the group consisting of graphite, fused silica, boron nitride, ceramic-bonded and sintered silicon nitride.

5. Apparatus according to claim 1, wherein said protective layer has an average thickness of between about 25 to 200 microns.

* * * * *